United States Patent
Choi

(10) Patent No.: US 9,672,157 B2
(45) Date of Patent: Jun. 6, 2017

(54) SEMICONDUCTOR DEVICE

(71) Applicant: SK hynix Inc., Incheon-si, Gyeonggi-do (KR)

(72) Inventor: Young Geun Choi, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 192 days.

(21) Appl. No.: 14/697,982

(22) Filed: Apr. 28, 2015

(65) Prior Publication Data
US 2016/0217838 A1    Jul. 28, 2016

(30) Foreign Application Priority Data

Jan. 26, 2015 (KR) .................... 10-2015-0012092

(51) Int. Cl.
*G11C 7/22* (2006.01)
*G06F 12/0891* (2016.01)

(52) U.S. Cl.
CPC ............ *G06F 12/0891* (2013.01); *G11C 7/22* (2013.01)

(58) Field of Classification Search
CPC ....................................................... G11C 7/22
USPC .............................................................. 711/100
See application file for complete search history.

(56) References Cited

U.S. PATENT DOCUMENTS

| 6,157,992 A * | 12/2000 | Sawada | G11C 7/1072 365/194 |
| 6,252,812 B1 * | 6/2001 | Maeda | G11C 7/1048 365/189.05 |
| 2007/0204185 A1 * | 8/2007 | Ogura | G11C 7/02 713/500 |
| 2009/0204841 A1 * | 8/2009 | Niwa | G01D 3/022 713/400 |
| 2013/0223177 A1 * | 8/2013 | Cho | G11C 8/06 365/230.06 |
| 2014/0310452 A1 * | 10/2014 | Kawakita | G06F 3/0658 711/105 |

FOREIGN PATENT DOCUMENTS

KR      20030097025 A   12/2003
KR    1020090067800 A    6/2009

* cited by examiner

*Primary Examiner* — Min Huang
(74) *Attorney, Agent, or Firm* — William Park & Associates Ltd.

(57) ABSTRACT

A semiconductor device may include an active controller configured to count pulses of an active signal, and activate an active masking signal for masking an active operation when the counted number of the active signal is greater than predetermined activation times of the active signal during a predetermined bank active section.

19 Claims, 4 Drawing Sheets

SEMICONDUCTOR DEVICE

CROSS-REFERENCE TO RELATED APPLICATION

This application claims priority based upon Korean patent application No. 10-2015-0012092, filed on Jan. 26, 2015, the disclosure of which is hereby incorporated in its entirety by reference herein.

BACKGROUND

1. Technical Field

Various embodiments generally relate to a semiconductor device, and more particularly to a technology for reducing current consumption of a semiconductor chip.

2. Related Art

Along with increasing integration of semiconductor memory devices, semiconductor memory devices have been continuously improved to increase operation speed thereof. In order to increase operation speeds of semiconductor memory devices, synchronous memory devices capable of operating by synchronizing with an external clock of a memory chip have recently been proposed and developed.

A representative example of a synchronous memory device is a single data rate (SDR) synchronous memory device. A SDR synchronous memory device is synchronized with a rising edge of an external clock of a memory device such that one data piece can be input and/or output at one data pin during one period of the clock.

However, the SDR synchronous memory device has difficulty in satisfying high-speed system operations.

In order to solve the problem of the SDR synchronous memory device, a double data rate (DDR) synchronous memory device capable of processing two pieces of data during one clock period has been proposed.

Two contiguous pieces of data are input and output through respective data input/output (I/O) pins of the DDR synchronous memory device, such that the two contiguous pieces of data are synchronized with a rising edge and a falling edge of an external input clock.

Therefore, although a clock frequency of the DDR synchronous memory device is not increased, the DDR synchronous memory device may have a bandwidth that is at least two times larger than that of the SDR synchronous memory device. Therefore, the DDR synchronous memory device can operate at a higher speed than the SDR synchronous memory device.

The semiconductor memory device has a plurality of banks. The banks are configured to increase a page hit rate as well as to increase the efficiency of a memory bus. If the memory device having multiple banks receives a control command from the external part, a drive control device of the memory device generates various control signals needed for the corresponding operation. The control signals are then transmitted to divided cell arrays (i.e., individual banks).

The data processing operations of the memory device are as follows.

First, a row address is applied to the semiconductor memory device in such a manner that the semiconductor memory device accesses a cell array matrix.

If the row address is applied to the semiconductor memory device the corresponding word line is activated, resulting in implementation of the sensing operation.

Therefore, data is read from or written in the cell designated upon receiving a column address.

If the memory device having multiple banks activates many banks within a window of a predetermined time, excessive current consumption may occur. Therefore, many developers or manufacturers of semiconductor memory devices have made efforts to reduce current consumption of the memory device having multiple banks.

SUMMARY

In accordance with an embodiment, a semiconductor device may include a command buffer configured to buffer a command signal and an active masking signal and output a reset signal and an active signal. The semiconductor device may include an active controller configured to count pulses of the active signal, activate a flag signal after lapse of a specific time, and output the activated flag signal. The semiconductor device may include an activation controller configured to selectively provide an activation signal in response to an inversion signal of the reset signal and the active signal. The semiconductor device may include a latch unit configured to latch an output signal of the activation controller for a predetermined time, and output a start signal. The semiconductor device may include a reset controller configured to receive the reset signal and a termination signal and output the inversion signal of the reset signal. The semiconductor device may include a pulse generator configured to delay the start signal for a predetermined time, and activate the termination signal when the start signal is deactivated. The semiconductor device may include a masking signal generator configured to receive the start signal and the flag signal and generate the active masking signal.

In accordance with an embodiment, a semiconductor device may include a command buffer configured to buffer a command signal and an active masking signal and output a reset signal and an active signal. The semiconductor device may include an active controller configured to count pulses of the active signal, activate a flag signal after lapse of a predetermined amount of time, and output the activated flag signal. The semiconductor device may include a pulse generator configured to generate the active masking signal in response to the active signal, the reset signal, and the flag signal, and control a reset operation of the active controller.

In accordance with an embodiment, a semiconductor device may include an active controller configured to count pulses of an active signal, and activate an active masking signal for masking an active operation when the counted number of pulses is greater than the number of activation times of the active signal during a predetermined bank active section.

DETAILED DESCRIPTION

Reference will now be made to various examples of embodiments, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter of the present disclosure.

Various embodiments may be directed to providing a semiconductor device that substantially obviates one or more problems due to limitations and disadvantages of the related art.

The embodiments of the present disclosure may relate to a technology for masking active pulses when banks are excessively activated within a predetermined time, and may prevent unnecessary current consumption from occurring by an excessive bank active operation within a predetermined window.

A semiconductor device may be designed to consume a smaller amount of power, and may define data pattern information signals as a specification (SPEC).

From among the SPEC-based data pattern information signals, a predetermined window (for example, tFAW; Four Bank Active Window, 4-bank active window) time is Joint Electron Device Engineering Council (JEDEC) defined in a manner that a predetermined number of banks (e.g., 4 banks) is activated within a window of a predetermined time.

In other words, the JEDEC is specification (SPEC) defined to prevent many more banks than a predetermined number of banks (e.g., 4 banks) from being simultaneously activated within a predetermined time.

The JEDEC SPEC has been proposed to prevent the occurrence of an abnormal situation in which an excessive amount of current is consumed when many banks are activated within a predetermined time so that a semiconductor chip malfunctions.

Figure 1:
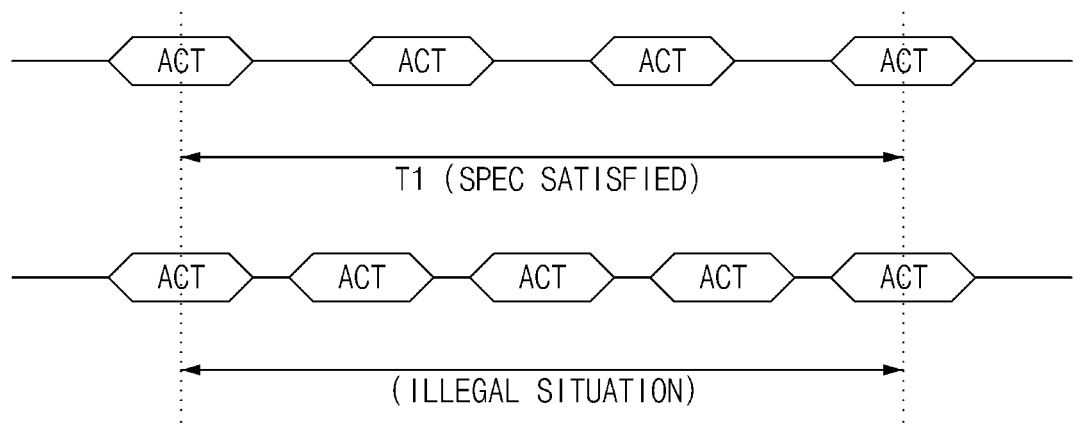
FIG. 1 is a conceptual diagram illustrating a representation of an example of a method for establishing the number of bank active times within a predetermined window.

FIG. 1 is a conceptual diagram illustrating a representation of an example of a method for establishing the number of bank active times within a predetermined window.

Referring to FIG. 1, a semiconductor memory bank may include a plurality of banks. The read or write operation for each bank may be controlled in the semiconductor memory bank.

A bank may be selected by combination of an external command and a bank address, and a word line designated by row address is activated in the selected bank, so that the read or write operation is achieved.

If the read or write operation is completed, the activated word line is precharged.

As described above, a series of processes for activating/precharging banks may be controlled per bank.

Each bank may be activated by an active command ACT. If the active command ACT is activated a predetermined number of times (e.g., 4 times) in the window interval of T1, a predetermined number of bank active times may be satisfied.

If the active command ACT is activated at least a predetermined number of times (e.g., at least 5 times) in the window interval of T1, the activation result exceeds the prescribed SPEC, resulting in the occurrence of an illegal situation.

The operation stability of a semiconductor chip may be deteriorated, assuming that the number of bank active times is not predetermined within a specific window interval, and the amount of internal current consumption excessively increases for a short time when the active command ACT is successively applied to the semiconductor memory device.

If the number of active pulses generated within a predetermined time is counted and the counted number of active pulses exceeds a predetermined number of times, the active pulses are masked. Therefore, an embodiment may prevent unnecessary current from being consumed by an excessive number of bank active operations within a window having a predetermined time.

Figure 2:
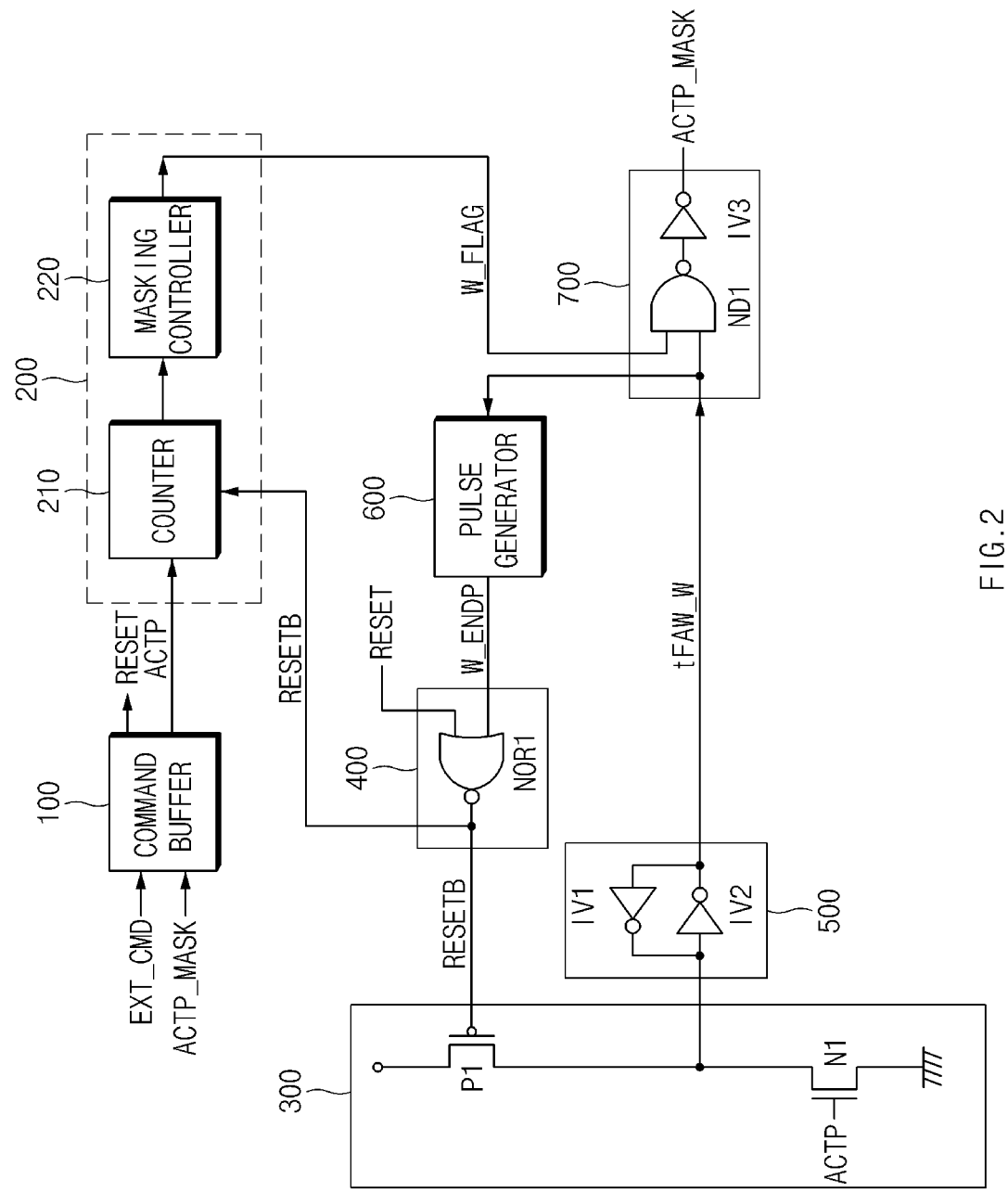
FIG. 2 is a schematic diagram illustrating a representation of an example of a semiconductor device according to an embodiment.

FIG. 2 is a schematic diagram illustrating a representation of an example of a semiconductor device according to an embodiment.

Referring to FIG. 2, the semiconductor device may include a command buffer 100, an active controller 200, and an activation controller 300. The semiconductor device may include a reset controller 400, a latch unit 500, and a pulse generator 600. The semiconductor device may include a masking signal generator 700. For example, the active controller 200 may include a counter 210 and a masking controller 220. In an embodiment, the activation controller 300, the reset controller 400, the latch unit 500, the pulse generator 600, and the masking signal generator 700 may be referred to as a pulse controller.

The command buffer 100 may buffer the command signal (EXT_CMD) and the active masking signal (ACTP_MASK). The command buffer 100 may output the reset signal (RESET) and the active signal (ACTP).

The active controller 200 may count pulses of the active signal (ACTP). The active controller 200 may activate a flag signal (W_FLAG) after lapse of a specific time (i.e., a predetermined amount of time). The active controller 200 may output the activated flag signal (W_FLAG).

The counter 210 may count the pulses of the active signal (ACTP) for a specific interval. For example, the counter 210 may be implemented as a 3-bit counter. The counter 210 may stop counting and/or reset the counting operation upon receiving the reset signal (RESETB). The reset signal (RESETB) may be an inversion signal of the reset signal (RESET).

After lapse of a specific time section in response to an output signal of the counter 210, the masking controller 220 may activate the flag signal (W_FLAG) and may output the activated flag signal (W_FLAG).

For example, when the most significant bit (MSB) from among output signals of the counter 210 is changed from a logic low level (i.e., a predetermined level) to a logic high level (i.e., a predetermined level), the masking controller 220 may activate the flag signal (W_FLAG) and output the activated flag signal (W_FLAG).

The activation controller 300 may provide the activation signal or the reset signal to the latch unit 500 in response to the reset signal (RESETB) and the active signal (ACTP).

The activation controller 300 may include a PMOS transistor P1 acting as a pull-up drive element. The activation controller 300 may include an NMOS transistor N1 acting as a pull-down drive element. The PMOS transistor P1 and the NMOS transistor N1 may be coupled in series between a power-supply voltage terminal and a ground voltage terminal. A gate terminal of the PMOS transistor P1 may be configured to receive the reset signal RESETB. A gate terminal of the NMOS transistor N1 may be configured to receive the active signal ACTP.

If the reset signal RESETB is activated to a logic low level, the PMOS transistor P1 is turned on allowing a power-supply voltage to be supplied to the latch unit 500. If the active signal ACTP is activated to a logic high level, the NMOS transistor N1 is turned on allowing a ground voltage to be supplied to the latch unit 500.

In an embodiment, the reset controller 400 may combine the reset signal RESET and the termination signal W_ENDP, and may output the reset signal RESETB.

In an embodiment, the reset controller 400 may include a logic gate. For example, the reset controller 400 may include, a NOR gate NOR1. The Nor gate NOR1 may be configured to perform a NOR operation with the reset signal RESET and the termination signal W_ENDP.

The latch unit 500 may latch the output signal of the activation controller 300 for a predetermined time, and may output a start signal (tFAW_W).

The latch unit 500 may activate the start signal (tFAW_W) for a predetermined period of time after lapse of activation of a first active signal ACTP.

In an embodiment, for example, the latch unit 500 may include inverters (IV1, IV2), input terminals and output terminals of which are interconnected by a latch structure.

The pulse generator 600 may delay the start signal (tFAW_W) for a predetermined time. The pulse generator 600 may activate the termination signal (W_ENDP) to a logic high level after lapse of a specific pulse section.

In an embodiment, the specific pulse section may indicate a predetermined bank active section.

The masking signal generator 700 may perform a logic operation, for example, an AND operation. The AND operation may be performed on the flag signal (W_FLAG) and the start signal (tFAW_W). The masking signal generator 700 may output the active masking signal (ACTP_MASK).

For example, the masking signal generator 700 may output the active masking signal (ACTP_MASK) of a logic high level when the flag signal (W_FLAG) and the start signal (tFAW_W) are activated to a logic high level.

In an embodiment, the masking signal generator 700 may include a NAND gate ND1 and an inverter IV3.

The NAND gate ND1 may perform a NAND operation with the flag signal (W_FLAG) and the start signal (tFAW_W). The inverter IV1 may invert the output signal of the NAND gate ND1, and may output the active masking signal (ACTP_MASK).

Figure 3:
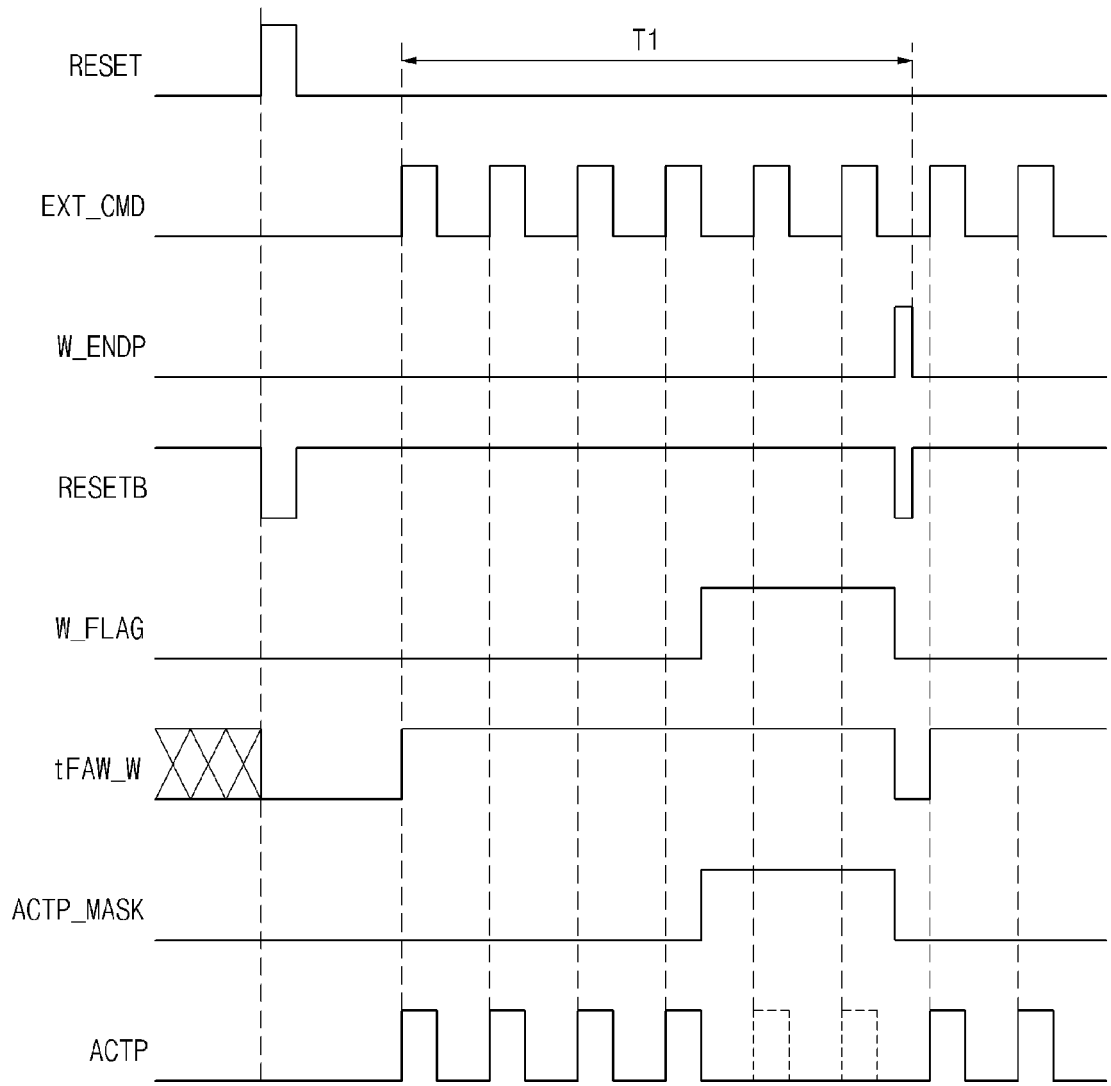
FIG. 3 is a timing diagram illustrating a representation of an example of the operations of a semiconductor device according to an embodiment.

FIG. 3 is a timing diagram illustrating a representation of an example of the operations of a semiconductor device according to an embodiment. The operations of a semiconductor device according to an embodiment will hereinafter be described with reference to FIG. 3.

Referring to FIG. 3, the command buffer 100 (see also FIG. 2) may activate the reset signal RESET to a logic high level before receiving the external command signal (EXT_CMD) and the active masking signal (ACTP_MASK), and may output the high-level reset signal RESET. As a result, all circuits are initialized by the reset signal RESET.

The reset signal RESETB indicated as an inversion signal of the reset signal RESET is activated to a logic low level.

The PMOS transistor P1 of the activation controller 300 is turned on, allowing the input terminal of the latch unit 500 to initialized to a logic high level.

Thereafter, if a predetermined section starts an operation, the external command signal (EXT_CMD) is buffered in the predetermined section, and begins to be activated to a logic high level. The command buffer 100 may activate the active signal ACTP to a high level, and may output the activated active signal ACTP.

Subsequently, if the active signal ACTP is activated to a logic high level, the NMOS transistor N1 is turned on.

Therefore, a low-level signal generated from the NMOS transistor N1 is latched for a latch time of the latch unit 500. The start signal (tFAW_W) is activated to a logic high level after lapse of a latch time of the latch unit 500.

In this example, if the reset signal RESET is at a logic low level and the termination signal (W_ENDP) is at a logic low level, the reset signal RESETB is at a logic high level. As a result, the PMOS transistor P1 remains turned off.

Thereafter, the counter 210 may count the number of pulses of the active signal ACTP, and output the counted result to the masking controller 220.

The masking controller 220 may pre-store timing information regarding a predetermined bank active section.

For example, the masking controller 220 may store a specific section in which the active signal (ACTP) pulse is activated four times as timing information of a predetermined bank active section.

Therefore, the masking controller 220 may activate the flag signal (W_FLAG) after lapse of the predetermined bank active section in response to the output signal of the counter 210, and may then output the activated flag signal (W_FLAG).

For example, after lapse of a specific section in which the active signal (ACTP) pulse is activated four times, the masking controller may activate the flag signal (W_FLAG) and may output the activated flag signal (W_FLAG).

For example, if the flag signal (W_FLAG) transitions to a logic high level, a pulse of the active signal (ACTP) received from an external part is a fifth or greater pulse.

Thereafter, the masking signal generator 700 may activate the active masking signal (ACTP_MASK) to a logic high level upon receiving the high-level flag signal (W_FLAG) and the high-level start signal (tFAW_W), and may then output the high-level active masking signal (ACTP_MASK).

Thereafter, if the active masking signal (ACTP_MASK) is activated, the command buffer 100 may deactivate the active signal ACTP to a logic low level irrespective of activation of the external command signal (EXT_CMD), so that the command buffer 100 may output the deactivated signal ACTP.

For example, the command buffer 100 may mask the active signal ACTP from the beginning of the activation section of the active masking signal (ACTP_MASK), and then output the masking result.

Thereafter, the pulse generator 600 may delay the start signal (tFAW_W) for a predetermined time after activation of the start signal (tFAW_W).

In this example, the pulse generator 600 may pre-store information regarding the bank active time.

For example, a specific section in which the start signal (tFAW_W) is at a high level may indicate that a predetermined bank active time does not elapse after activation of a first active signal ACTP.

The pulse generator 600 may activate the termination signal (W_ENDP) after delay of a predetermine time upon activation of the start signal (tFAW_W), and then output the activated termination signal (W_ENDP).

If the termination signal (W_ENDP) is activated to a logic high level, the reset controller 400 may activate the reset signal RESETB to a logic low level and then output the activated reset signal.

As a result, the PMOS transistor P1 is turned on allowing for the output signal of the activation controller 300 to transition to a logic high level and the start signal (tFAW_W) transition to a logic low level.

If the reset signal RESETB is activated to a logic low level, the counter 210 is reset.

Therefore, the masking controller 220 may transition the flag signal (W_FLAG) to a logic low level. The masking signal generator 700 may transition the active masking signal (ACTP_MASK) to a logic low level.

Thereafter, a predetermined bank active section is terminated and the active masking signal ACTP_MASK transitions to a logic low level. As a result, the command buffer 100 stops masking, and activates the active signal ACTP in response to the external command signal EXT_CMD.

As is apparent from the above description, the semiconductor device masks actively pulses when the number of active operations is higher than a predetermined number of times, and thus may prevent unnecessary current consumption from occurring by an excessive bank active operation within a predetermined window.

Figure 4:
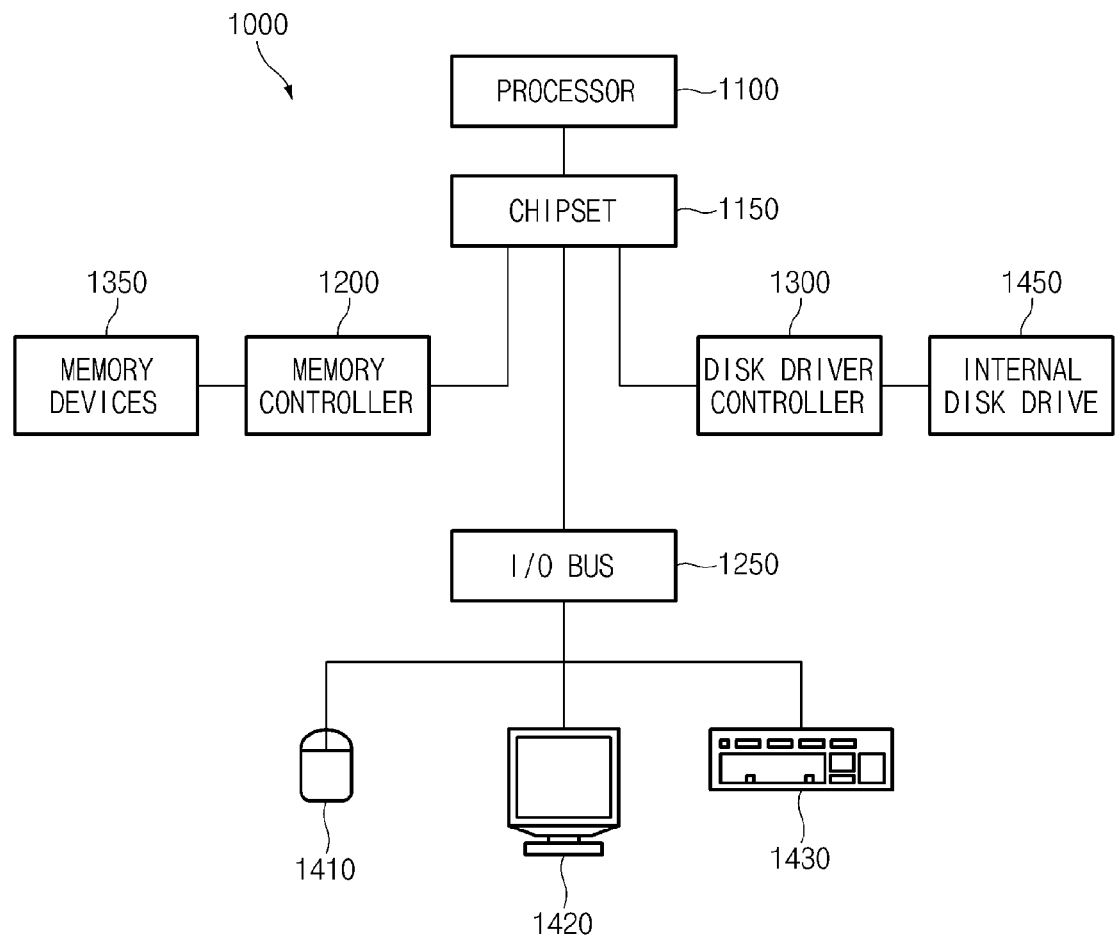
FIG. 4 illustrates a block diagram of an example of a representation of a system employing the semiconductor device in accordance with the various embodiments discussed above with relation to FIGS. 1-3.

The semiconductor device discussed above (see FIGS. 1-3) are particular useful in the design of memory devices, processors, and computer systems. For example, referring to FIG. 4, a block diagram of a system employing the semiconductor device in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor device as discussed above with reference to FIGS. 1-3. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor device as discussed above with relation to FIGS. 1-3, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 4 is merely one example of a system employing the semiconductor device as discussed above with relation to FIGS. 1-3. In alternate embodiments, such as cellular phones or digital cameras, the components may differ from the embodiments illustrated in FIG. 4.

Those skilled in the art will appreciate that the embodiments may be carried out in other specific ways than those set forth herein without departing from the spirit and essential characteristics of the application. The above embodiments are therefore to be construed in all aspects as illustrative and not restrictive. All changes coming within the meaning and equivalency range of the appended claims are intended to be embraced therein. In addition, it is obvious to those skilled in the art that claims that are not explicitly cited in each other in the appended claims may be presented in combination as an embodiment of the application or included as a new claim by a subsequent amendment after the application is filed.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A semiconductor device comprising:
   a command buffer configured to buffer a command signal and an active masking signal and output a reset signal and an active signal;
   an active controller configured to count pulses of the active signal, activate a flag signal after lapse of a specific time, and output the activated flag signal;
   an activation controller configured to selectively provide an activation signal in response to an inversion signal of the reset signal and the active signal;
   a latch unit configured to latch an output signal of the activation controller for a predetermined time, and output a start signal;
   a reset controller configured to receive the reset signal and a termination signal and output the inversion signal of the reset signal;
   a pulse generator configured to delay the start signal for a predetermined time, and activate the termination signal when the start signal is deactivated; and
   a masking signal generator configured to receive the start signal and the flag signal and generate the active masking signal.

2. The semiconductor device according to claim 1, wherein the command buffer is configured to deactivate the active signal when the active masking signal is activated, irrespective of the command signal.

3. The semiconductor device according to claim 1, wherein the active controller includes:
   a counter configured to count pulses of the active signal for a specific time section; and
   a masking controller configured to activate the flag signal after lapse of the specific time section in response to an output signal of the counter.

4. The semiconductor device according to claim 3, wherein the counter stops counting the pulses of the active signal and resets a counting operation in response to receiving the inversion signal of the reset signal.

5. The semiconductor device according to claim 3, wherein the masking controller is configured to activate the flag signal when the most significant bit (MSB) from among output signals of the counter transitions from a first predetermined level to a second predetermined level.

6. The semiconductor device according to claim 3, wherein the masking controller is configured to prestore timing information regarding a predetermined bank active section.

7. The semiconductor device according to claim 3, wherein the masking controller is configure to store a specific section in which the pulse of the active signal is activated four times, as timing information of a predetermined bank active time section.

8. The semiconductor device according to claim 3, wherein the masking controller is configured to activate the flag signal after lapse of a predetermined bank active section in response to an output signal of the counter.

9. The semiconductor device according to claim 1, wherein the activation controller includes:
   a pull-up drive element configured to output a high-level signal to the latch unit in response to an inversion signal of the reset signal; and
   a pull-down drive element configured to output a low-level signal to the latch unit in response to the active signal.

10. The semiconductor device according to claim 1, wherein the reset controller includes:
    a NOR gate configured to perform a logic NOR operation with the reset signal and the termination signal and output the inversion signal of the reset signal.

11. The semiconductor device according to claim 1, wherein the latch unit includes a first inverter and a second inverter, input terminals and output terminals interconnected by a latch structure.

12. The semiconductor device according to claim 1, wherein the latch unit is configured to activate the start signal for a predetermined bank active section after activation of a first active signal.

13. The semiconductor device according to claim 1, wherein the masking signal generator is configured to output the active masking signal by performing a logic operation with the flag signal and the start signal.

14. The semiconductor device according to claim 1, wherein the command buffer is configured to activate the reset signal before receiving the command signal and the active masking signal, and initialize an input terminal of the latch unit to a logic high level.

15. The semiconductor device according to claim 1, wherein:
    after a predetermined bank active time is delayed upon activation completion of the start signal, the pulse generator is configured to activate the termination signal.

16. The semiconductor device according to claim 1, wherein the reset controller is configured to activate the inversion signal of the reset signal to a logic low level when the termination signal is activated to a logic high level.

17. A semiconductor device comprising:
    a command buffer configured to buffer a command signal and an active masking signal and output a reset signal and an active signal;
    an active controller configured to count pulses of the active signal, activate a flag signal after lapse of a predetermined amount of time, and output the activated flag signal; and
    a pulse generator configured to generate the active masking signal in response to the active signal, the reset signal, and the flag signal, and control a reset operation of the active controller.

18. The semiconductor device according to claim 17, wherein the pulse generator includes:
    an activation controller configured to selectively provide an activation signal in response to an inversion signal of the reset signal and the active signal;
    a latch unit configured to latch an output signal of the activation controller for a predetermined time, and output a start signal;
    a reset controller configured to receive the reset signal and a termination signal and output the inversion signal of the reset signal;
    a pulse generator configured to delay the start signal for a predetermined time, and activate the termination signal when the start signal is deactivated; and
    a masking signal generator configured to receive the start signal and the flag signal and generate the active masking signal.

19. The semiconductor device according to claim 17, wherein the command buffer is configured to deactivate the active signal when the active masking signal is activated, irrespective of the command signal.

* * * * *